United States Patent
Kim

(10) Patent No.: US 12,557,504 B2
(45) Date of Patent: Feb. 17, 2026

(54) DISPLAY APPARATUS

(71) Applicant: LG DISPLAY CO., LTD., Seoul (KR)

(72) Inventor: SeHwan Kim, Gyeonggi-do (KR)

(73) Assignee: LG Display Co., Ltd (KR)

( * ) Notice: Subject to any disclaimer, the term of this patent is extended or adjusted under 35 U.S.C. 154(b) by 491 days.

(21) Appl. No.: 17/985,961

(22) Filed: Nov. 14, 2022

(65) Prior Publication Data

US 2023/0217760 A1 Jul. 6, 2023

(30) Foreign Application Priority Data

Dec. 30, 2021 (KR) ................ 10-2021-0192141

(51) Int. Cl.
*H10K 59/131* (2023.01)
*H10K 59/35* (2023.01)
*H10K 59/65* (2023.01)

(52) U.S. Cl.
CPC ....... *H10K 59/1315* (2023.02); *H10K 59/353* (2023.02); *H10K 59/65* (2023.02)

(58) Field of Classification Search
CPC ... H10K 59/1315; H10K 59/353; H10K 59/65
See application file for complete search history.

(56) References Cited

U.S. PATENT DOCUMENTS

| | | |
|---|---|---|
| 2012/0306826 A1 | 12/2012 | Tsuchi |
| 2021/0241696 A1 | 8/2021 | Cho et al. |
| 2021/0343823 A1 | 11/2021 | Tanaka et al. |

FOREIGN PATENT DOCUMENTS

| | | |
|---|---|---|
| CN | 107274845 A | 10/2017 |
| CN | 109951925 A | 6/2019 |
| CN | 113451373 A | 9/2021 |
| EP | 3131086 A1 | 2/2017 |
| JP | 2019-075229 A | 5/2019 |
| KR | 20200066471 A | 6/2020 |
| KR | 20200066502 A | 6/2020 |
| KR | 20200072956 A | 6/2020 |

OTHER PUBLICATIONS

Zhang et al., CN 109300970, Sep. 25, 2020 (Year: 2020).*
Deng et al., CN 111682054, Sep. 18, 2020 (Year: 2020).*
Xu et al., CN 112909058, Apr. 6, 2021 (Year: 2021).*
Wu et al., CN 113299712, Aug. 24, 2021 (Year: 2021).*
Wei et al., WO 2021102791, Jun. 3, 2021 (Year: 2021).*
Zhou et al., WO 2021203917, Oct. 14, 2021 (Year: 2021).*
Office Action in Korean Appln. No. 20210192141, mailed on Jan. 20, 2025, 14 pages (with English translation).
Office Action in Chinese Appln. No. 202211665101.1, mailed on Apr. 22, 2025, 14 pages (with English translation).
Notice of Allowance in Korean Appln. No. 10-2021-0192141, mailed on Oct. 29, 2025, 4 pages (with English translation).
Notice of Allowance in Chinese Appln. No. 202211665101.1, mailed on Jan. 9, 2026, 8 pages (with English translation).

\* cited by examiner

*Primary Examiner* — Mary Ellen Bowman
(74) *Attorney, Agent, or Firm* — Fish & Richardson P.C.

(57) ABSTRACT

A display apparatus includes a substrate including a display area, a camera hole, and a non-display area, a light-emitting element disposed in the display area, a gate driver disposed in the non-display area, and an initialization signal line disposed in the display area, wherein the display area includes left and right display areas with respect to the camera hole, and an array pixel area, and the initialization signal line is disposed in each of the left display area and the right display area.

18 Claims, 12 Drawing Sheets

DISPLAY APPARATUS

CROSS-REFERENCE TO RELATED DISCLOSURE

This application claims the priority of Korean Patent No. 10-2021-0192141, filed on Dec. 30, 2021, which is hereby incorporated by reference in its entirety.

BACKGROUND

Field of the Disclosure

The present disclosure relates to a display apparatus, and more particularly, to a display apparatus in which a camera hole is disposed.

Description of the Background

Recently, as the information age has arrived, displays visually expressing electrical information signals have been rapidly developed. In response to such a trend, various display apparatuses having excellent performance, such as a thin profile, a light weight, and low power consumption, have been developed.

Specific examples of such display apparatuses include a liquid crystal display (LCD) apparatus, an organic light-emitting diode (OLED) display apparatus, and a quantum dot display apparatus.

A display apparatus may include a display panel and a plurality of components for providing various functions. For example, in an existing display apparatus, cameras and various optical sensors are disposed at a peripheral portion of a display panel to perform various functions such as photographing, face recognition, and infrared distance measurement functions. However, through successive generations, so-called bezel-less or bezel-free designs, in which a screen is fully filled with a display area when a user looks at the display apparatus, have become more common, which makes it difficult to arrange such cameras and optical sensors. In order to achieve such a bezel-less or bezel-free design, research has been conducted on a method of moving cameras and optical sensors inside a display area of a display panel. As a result of the research, a technology called a hole-in display (HID) has been developed in which holes can be formed in a display panel to arrange cameras and optical sensors inside the holes in a display panel.

Although an HID has been described above in order to express that a hole is present in a display area, a hole-in active area (HiAA) may also be used in order to express that a hole is present inside an active area.

As an HID or an HiAA is developed and all cameras and sensors placed in the existing bezel area are moved to the inside of an active area of a display panel, extreme bezel-less or bezel-free designs can be applied.

A display area and an active area may be synonymously to describe an area in which a pixel is driven to emit light.

SUMMARY

The present disclosure is directed to solving the above-described problems that may occur in designing a hole-in display (HID) or hole-in active area (HiAA) structure.

Holes in which cameras or optical sensors are disposed may be formed in a display area or an active area. In this case, components such as a light-emitting element or a driving transistor required for display may not be disposed in a hole area, and even a substrate of a display panel may be removed. Accordingly, since lines and the like cannot be disposed in the hole area, gate signal lines between display areas disposed at left and right sides of the hole area may be designed to bypass the hole area. Due to such a design, a difference between an RC load of the left display area and an RC load of the right display area with respect to the hole area occurs, and thus, it has been recognized that the quality of a display apparatus is degraded.

In particular, on a black screen, there is a reddish brightness phenomenon in the right display area of the hole area. Accordingly, the inventors of the present disclosure have developed a display apparatus having a new structure in order to solve a problem caused by an RC load difference that may occur in a display apparatus having a hole area.

Specifically, an aspect of the present disclosure is to provide a display apparatus capable of compensating for a RC load difference in a display area due to the formation of an HiAA structure by arranging a line structure for compensating RC load around a hole area formed due to the formation of the HiAA structure.

Another aspect of the present disclosure is to provide a display apparatus capable of compensating for an RC load difference between a left display area and a right display area of a hole area and between an upper display area and a lower display area of the hole area according to the formation of an HiAA structure.

A main point of the present disclosure is that, in order to design a bezel-less or bezel-free display panel which is a development trend of display apparatuses, holes for arranging cameras and sensors in a display area are formed, and also, defective products are prevented from being produced due to the holes.

In an aspect, aspects of the present disclosure may provide a display apparatus that includes a substrate including a display area, a camera hole, and a non-display area, a light-emitting element disposed in the display area, a gate driver disposed in the non-display area, and an initialization signal line disposed in the display area.

The display area may include a left display area, a right display area, and an array pixel area with respect to the camera hole, and the initialization signal line may be disposed in each of the left display area and the right display area.

In another aspect, aspects of the present disclosure may provide a display apparatus including a substrate including a display area, a camera hole, and a non-display area, a light-emitting element disposed in the display area, a gate driver disposed in the non-display area, and an initialization signal line disposed in the display area.

The display area may include a left display area, a right display area, and an array pixel area with respect to the camera hole, and the initialization signal line may include a low resistance initialization signal line and a high resistance initialization signal line.

Other detailed matters of the aspects are included in the detailed description and the drawings.

In a display apparatus according to aspects of the present disclosure, a line structure for compensating RC load is disposed in each of left and right display areas of a hole area according to an HiAA structure to reduce an RC load difference between the left display area and the right display area, thereby preventing quality degradation.

According to the present disclosure, a line structure for compensating for an RC load difference between a left display area and a right display area of a hole area and between an upper display area and a lower display area of the hole area according to an HiAA structure is disposed to reduce the RC load difference between the surrounding display areas due to the hole area, thereby preventing the overall quality degradation of a display apparatus.

Therefore, a user of a display apparatus can aesthetically use a device in which a front surface of a display apparatus is fully filled with a light-emitting screen, and by using a compact module that is functionally applied to a narrow bezel, a better sense of grip and a sense of light weight can be provided to the user.

The effects of the present disclosure are not limited to the above-described effects, and other effects not described above will be apparent to a person having ordinary skill in the art from the following description.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
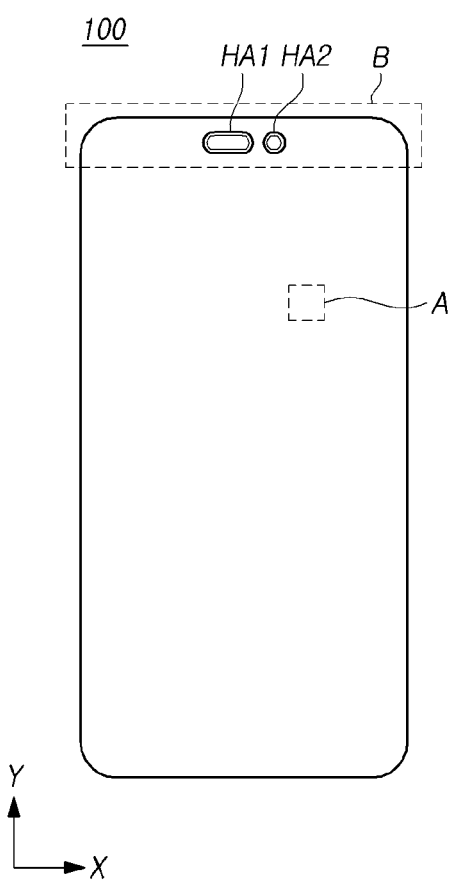
FIG. 1 is a plan view illustrating a front surface of a display panel according to an aspect of the present disclosure.

The advantages and features of the present disclosure and methods for accomplishing the same will be more clearly understood from aspects to be described in detail below with reference to the accompanying drawings. However, the present disclosure is not limited to the following aspects but may be implemented in various different forms. The present aspects are provided only to complete the present disclosure and to fully provide the scope of the present disclosure to a person having ordinary skill in the art to which the present disclosure pertains, and the present disclosure will be defined by the appended claims.

Shapes, sizes, ratios, angles, and numbers disclosed in the drawings for describing the aspects of the present disclosure are merely examples, and thus, the present disclosure is not limited to the illustrated details. Like reference numerals refer to like elements throughout. In describing the present disclosure, when the detailed description of the relevant known function or configuration is determined to unnecessarily obscure an important point of the present disclosure, the detailed description will be omitted. In a case where "comprise," "have," and "include" described in the present disclosure are used, another part may be added unless "only" is used. Any references to singular may include plural unless expressly stated otherwise.

In construing a component, the component is construed as including an error range even if there is no explicit description.

In describing a position relationship, for example, when a position relation between two parts is described as "on," "over," "under," or "next," one or more other parts may be "immediately" or "directly" is used.

In describing a time relationship, for example, when the temporal order is described as "after," "subsequent," "next," or "before," a case which is not continuous may be included unless "immediately" or "right" is used.

It should be understood that, although terms such as "first," "second," and the like may be used herein to describe various components, these components are not limited by these terms. These terms are only used to distinguish one element or component from another element or component. Therefore, a first component described below could be termed a second component without departing from the scope and spirit of the present disclosure.

In describing the components of the present disclosure, terms such as "first," "second," "A," "B," "(a)," and "(b)" may be used. These terms are merely for the purpose of differentiating one component from another component, and the essence, sequence, order, or number of a corresponding element should not be limited by the terms. When a component is described as "connected," "coupled," or "linked" to another component, it may mean not only that the components are directly "connected," "coupled," or "linked" but also that they are indirectly "connected," "coupled," or "linked" through still another component.

In the present disclosure, a "display apparatus" may include a narrow-sense display apparatus such as a liquid crystal module (LCM), an organic light-emitting diode (OLED) module, or a quantum dot (QD) module which includes a display panel and a driver for driving the display panel. The display apparatus may include a set electronic device or a set device (or a set apparatus) such as a laptop computer, a television, a computer monitor, an equipment apparatus including an automotive apparatus or other type apparatuses for vehicles, or a mobile electronic device such as a smartphone or an electronic pad, which is a complete product (or a final product) including an LCM, an OLED module, a QD module, or the like.

Therefore, in the present disclosure, the display apparatus may include a narrow-sense display apparatus itself, such as an LCM, an OLED module, or a QD module and a set device which is an disclosure product or a final consumer device including an LCM, an OLED module, a QD module, or the like.

In some cases, an LCM, an OLED module, or a QD module including a display panel, a driver, and the like may be referred to as a "narrow-sense display apparatus," and an electronic device which is a final product including an LCM, an OLED module, or a QD module may be referred to as a "set device." For example, the narrow-sense display apparatus may include a display panel, such as a liquid crystal display (LCD), an OLED, or a QD display panel and a source printed circuit board (PCB) which is a controller for driving the display panel. The set device may further include a set PCB which is a set controller electrically connected to a source PCB to control the entirety of the set device.

As a display panel used in the present aspect, any type of display panel such as an LCD panel, an OLED display panel, or a QD display panel may be used, but the present disclosure is not limited to a specific display panel which is bendable by including a flexible substrate for the OLED display panel and a back play support structure thereunder. A shape or a size of a display panel used in a display apparatus according to aspects of the present disclosure is not limited.

More specifically, when the display panel is the OLED display panel, the display panel may include a plurality of gate lines, a plurality of data lines, and pixels formed in intersection areas of the gate lines and the data lines. The display panel may include an array including a thin film transistor which is an element for selectively applying a voltage to each pixel, an OLED layer on the array, and an encapsulation substrate or encapsulation layer disposed on the array to cover the OLED layer. The encapsulation layer may protect the thin film transistor and the OLED layer from an external impact and may prevent moisture or oxygen from permeating into the OLED layer. A layer formed on the array may include an inorganic light-emitting layer, for example, a nano-sized material layer, QDs, or the like.

In the present disclosure, FIG. 1 illustrates an exemplary OLED display panel 100 which may be integrated with components inside display apparatuses.

FIG. 1 is a plan view illustrating the display panel 100 according to an aspect of the present disclosure. In the present disclosure, FIG. 1 illustrates the exemplary OLED display panel 100 which may be integrated with components inside the display apparatuses. Referring to FIG. 1, in the OLED display panel 100, a plurality of camera holes HA1 and HA2 are formed inside a display area, thereby reducing a bezel area which is a non-display area and maximizing the display area. A product designed to maximize a display area may be aesthetically preferable because it maximizes an immersion level of a user.

In the plurality of camera holes HA1 and HA2, as shown in FIG. 1, a first camera hole HA1 and a second camera hole HA2 may be disposed at a central portion of an upper side of the display area, but the present disclosure is not limited thereto. The first camera hole HA1 and the second camera hole HA2 may be disposed at various locations.

Figure 2:
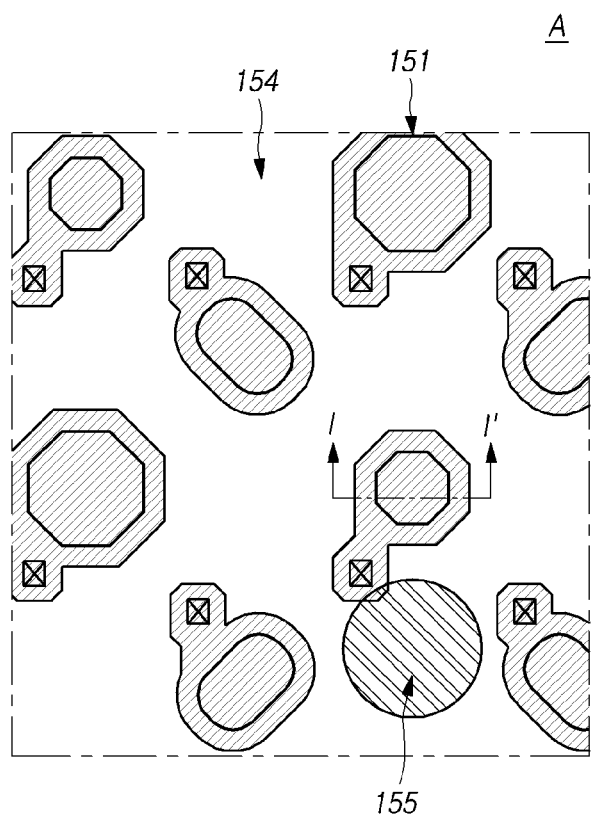
FIG. 2 is an enlarged plan view of area A of FIG. 1 which illustrates a display area.

FIG. 2 is an enlarged view of area A which is a portion of the display area of the display panel 100 of FIG. 1 and illustrates a planar shape of subpixels disposed in the display area.

In FIG. 2, a plurality of anodes 151 may be disposed in the display area, and a bank 154 may fill an area between the anodes 151. The bank 154 may be disposed to cover an edge of the anode 151 and may serve to define an emission area of the subpixel by allowing only a middle area of the anode 151 to be in contact with an organic light-emitting stack. Spacers 155 may be disposed in a portion of an area in which the bank 154 is disposed. The spacers 155 may be disposed to have a constant density in the entire display panel 100. The spacer 155 may serve to support a mask such that the mask for deposition, which covers or opens an organic layer for each subpixel, is not in direct contact with the display panel 100 when a deposition process is performed to form the organic light-emitting stack. Although FIG. 2 illustrates an example of a PenTile-type planar structure in which the subpixels are arranged in dot shapes, the present disclosure is not limited thereto, and a real-type planar structure may also be used.

Figure 3:
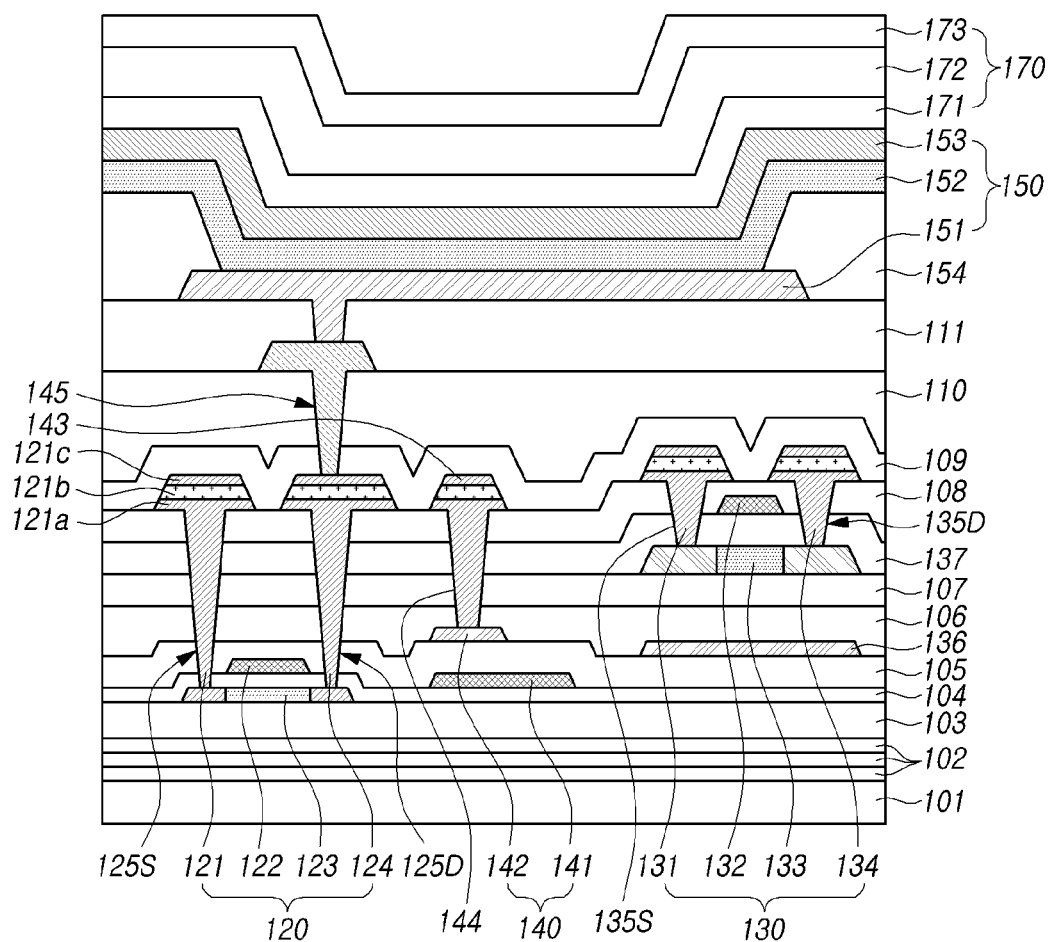
FIG. 3 is a cross-sectional view along line I-I' of FIG. 2 which illustrates a subpixel.

FIG. 3 illustrates a cross-sectional structure along line I-I' of FIG. 2 which illustrates the subpixel.

Referring to FIG. 3, a substrate 101, a multi-buffer layer 102, and a lower buffer layer 103 may be provided, and a first transistor 120 may be disposed on the lower buffer layer 103. A lower gate insulating film 104 may be disposed on a first semiconductor layer 123 constituting the first transistor 120 to insulate the first semiconductor layer 123 from a first gate electrode 122. A first lower interlayer insulating film 105 and a second lower interlayer insulating film 106 may be sequentially disposed on the first gate electrode 122, and an upper buffer layer 107 may be disposed.

The multi-buffer layer 102 may delay diffusion of moisture or oxygen permeating into the substrate 101 and may be formed by alternately stacking silicon nitride (SiNx) and silicon oxide (SiOx) at least one time.

The lower buffer layer 103 may protect the first semiconductor layer 123 and perform a function of blocking various types of defects introduced from the substrate. The lower buffer layer 103 may be made of a-Si, silicon nitride (SiNx), silicon oxide (SiOx), or the like.

The first semiconductor layer 123 of the first transistor 120 may be formed as a polycrystalline semiconductor layer and may include a channel region, a source region, and a drain region.

The polycrystalline semiconductor layer may have higher mobility than an amorphous semiconductor layer and an oxide semiconductor layer and thus may have low power consumption and excellent reliability. Due to such advantages, the polycrystalline semiconductor layer may be used for a driving transistor.

The first gate electrode 122 may be disposed on the lower gate insulating film 104 and may be disposed to overlap with the first semiconductor layer 123.

A second transistor 130 may be disposed on the upper buffer layer 107, and a light blocking layer 136 may be disposed under an area corresponding to the second transistor 130. Referring to FIG. 3, the light blocking layer 136 may be disposed on the first lower interlayer insulating film 105 in the area corresponding to the second transistor 130, and a second semiconductor layer 133 of the second transistor 130 may be disposed on the second lower interlayer insulating film 106 and the upper buffer layer 107 to overlap with the light blocking layer 136. An upper gate insulating film 137 may be disposed on the second semiconductor layer 133 to insulate a second gate electrode 132 from the second semiconductor layer 133, and then an upper interlayer insulating film 108 may be disposed on the second gate electrode 132. The first gate electrode 122 and the second gate electrode 132 may be formed as a single layer or a multi-layer including one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto.

The first and second lower interlayer insulating films 105 and 106 may be formed as inorganic films having a higher hydrogen particle content as compared with the upper interlayer insulating film 108. For example, the first and second lower interlayer insulating films 105 and 106 are made of silicon nitride (SiNx) formed through a deposition process using NH3 gas, and the upper interlayer insulating film 108 may be made of silicon oxide (SiOx). Hydrogen particles included in the first and second lower interlayer insulating films 105 and 106 may diffuse into the polycrystalline semiconductor layer during a hydrogenation process to fill pores in the polycrystalline semiconductor layer with hydrogen. Accordingly, the polycrystalline semiconductor layer may be stabilized, thereby preventing degradation in characteristics of the first transistor 120. After an activation and hydrogenation process of the first semiconductor layer 123 of the first transistor 120, the second semiconductor layer 133 of the second transistor 130 may be formed, and in this case, the second semiconductor layer 133 may be made of an oxide semiconductor. Since the second semiconductor layer 133 is not exposed to a high-temperature atmosphere of the activation and hydrogenation process of the first semiconductor layer 123, damage to the second semiconductor layer 133 can be prevented, thereby improving reliability. After the upper interlayer insulating film 108 is disposed, a first source contact hole 125S and a first drain contact hole 125D may be formed to correspond to the source region and the drain region of the first transistor, and a second source contact hole 135S and a second drain contact hole 135D may be respectively formed to correspond to a source region and a drain region of the second transistor 130. Referring to FIG. 3, the first source contact hole 125S and the first drain contact hole 125D may be continuously formed from the upper interlayer insulating film 108 to the lower gate insulating film 104, and the second source contact hole 135S and the second drain contact hole 135D may also be formed in the second transistor 130. A first source electrode 121 and a first drain electrode 124 corresponding to the first transistor 120 and a second source electrode 131 and a second drain electrode 134 corresponding to the second transistor 130 can be formed at the same time, thereby reducing the number of times of processes of forming the source and drain electrodes of each of the first transistor 120 and the second transistor 130.

The first source and drain electrodes 121 and 124 and the second source and drain electrodes 131 and 134 may be formed as a single layer or a multi-layer made of one of molybdenum (Mo), aluminum (Al), chromium (Cr), gold (Au), titanium (Ti), nickel (Ni), neodymium (Nd), and copper (Cu), or an alloy thereof, but the present disclosure is not limited thereto. The first source and drain electrodes 121 and 124 and the second source and drain electrodes 131 and 134 may have a three-layered structure. For example, the first source electrode 121 may include a first layer 121a, a second layer 121b, and a third layer 121c, and other source and drain electrodes may have the same structure as the first source electrode 121.

A storage capacitor 140 may be disposed between the first transistor 120 and the second transistor 130. As shown in FIG. 3, the storage capacitor 140 may be formed by overlapping with a storage lower electrode 141 and a storage upper electrode 142 with the first lower interlayer insulating film 105 interposed therebetween.

The storage lower electrode 141 may be positioned on the lower gate insulating film 104, formed to be coplanar with the first gate electrode 122, and made of the same material as the first gate electrode 122. The storage upper electrode 142 may be electrically connected to a pixel circuit through a storage supply line 143. The storage upper electrode 142 may be formed to be coplanar with the light blocking layer 136 and made of the same material as the light blocking layer 136. The storage upper electrode 142 is exposed through a storage contact hole 144 passing through the second lower interlayer insulating film 106, the upper buffer layer 107, the upper gate insulating film 137, and the upper interlayer insulating film 108 and is connected to the storage supply line 143. Meanwhile, although the storage upper electrode 142 is spaced apart from the light blocking layer 136 as shown in FIG. 3, the storage upper electrode 142 may be connected to the light blocking layer 136 to be formed integrally with the light blocking layer 136. The storage supply line 143 may be formed to be coplanar with the first source and drain electrodes 121 and 124 and the second source and drain electrodes 131 and 134 and made of the same material as the first source and drain electrodes 121 and 124 and the second source and drain electrodes 131 and 134. Accordingly, the storage supply line 143 may be formed simultaneously with the first source and drain electrodes 121 and 124 and the second source and drain electrodes 131 and 134 through the same mask process.

A protective film 109 may be formed by depositing an inorganic insulating material such as SiNx or SiOx on an entire surface of the substrate 101 on which the first source and drain electrodes 121 and 124, the second source and drain electrodes 131 and 134, and the storage supply line 143 are formed. A first planarization layer 110 may be formed on the substrate 101 on which the protective film 109 is formed. Specifically, the first planarization layer 110 may be disposed by applying an organic insulating material such as an acrylic resin onto the entire surface of the substrate 101 on which the protective film 109 is formed.

After the protective film 109 and the first planarization layer 110 are disposed, a contact hole exposing the first source electrode 121 or the first drain electrode 124 of the first transistor 120 may be formed through a photolithography process. A connection electrode 145 made of a material including Mo, Ti, Cu, AlNd, Al, Cr, or an alloy thereof may be disposed in an area of the contact hole exposing the first drain electrode 124.

A second planarization layer 111 may be disposed on the connection electrode 145, and a contact hole exposing the connection electrode 145 may be formed in the planarization layer 111 to arrange a light-emitting element 150 connected to the first transistor 120.

The light-emitting element 150 may include the anode 151 connected to the first drain electrode 124 of the first transistor 120, at least one organic light-emitting stack 152 formed on the anode 151, and a cathode 153 formed on the organic light-emitting stack 152.

The organic light-emitting stack 152 may include a hole injection layer, a hole transport layer, an emission layer, an electron transport layer, and an electron injection layer, and in a tandem structure in which a plurality of emission layers overlap with each other, a charge generation layer may be additionally disposed between the emission layer and the emission layer. In some cases, the emission layer may emit light having different colors for each subpixel. For example, a red emission layer, a green emission layer, and a blue emission layer may be separately formed for each subpixel. However, a common emission layer may be formed to emit white light without color discrimination for each pixel, and a color filter for discriminating colors may be separately provided. The discrimination may be classified into a red-green-blue (RGB) type (real RGB type) and a white OLED (WOLED). Each emission layer may be individually formed, but the injection layer or the transport layer may be provided as a common layer and may be equally disposed for each subpixel.

The anode 151 may be connected to the connection electrode 145 exposed through a contact hole passing through the second planarization layer 111. The anode 151 may be formed in a multi-layered structure including a transparent conductive film and an opaque conductive film having high reflection efficiency. The transparent conductive film is made of a material having a relatively large work function value, such as indium-tin-oxide (ITO) and indium-zinc-oxide (IZO), and the opaque conductive film has a single-layered or multi-layered structure including Al, Ag, Cu, Pb, Mo, Ti, or an alloy thereof. For example, the anode 151 may be formed in a structure in which a transparent conductive film, an opaque conductive film, and a transparent conductive film are sequentially stacked or in a structure in which a transparent conductive film and an opaque conductive film are sequentially stacked. The anode 151 may be disposed in the emission area provided by the bank 154 as well as on the second planarization layer 111 to overlap with a pixel circuit area in which the first and second transistors 120 and 130 and the storage capacitor 140 are disposed, thereby increasing an area for emitting light.

The organic light-emitting stack 152 may be formed by stacking the hole transport layer, the organic emission layer, and the electron transport layer on the anode 151 in that order or in the reverse order. In addition, the organic light-emitting stack 152 may further include a charge generation layer and may include first and second light-emitting stacks facing each other with the charge generation layer interposed therebetween.

The bank 154 may be formed to expose the anode 151. The bank 154 may be made of an organic material such as photoacrylic and may include a translucent material, but the present disclosure is not limited thereto. The bank 154 may be made of an opaque material to prevent light interference between the subpixels.

The cathode 153 may be formed on an upper surface of the organic light-emitting stack 152 to face the anode 151 with the organic light-emitting stack 152 interposed therebetween. When the cathode 153 is applied to a top emission type organic light-emitting display apparatus, the cathode 153 may be formed by forming a transparent conductive film to be thin using ITO, IZO, or magnesium-silver (Mg—Ag).

An encapsulation layer 170 for protecting the light-emitting element 150 may be formed on the cathode 153. Since the light-emitting element 150 reacts with external moisture or oxygen due to the characteristics of an organic material of the organic light-emitting stack 152, dark-spots or pixel shrinkage may occur. In order to prevent the dark-spots or pixel shrinkage, the encapsulation layer 170 may be disposed on the cathode 153. The encapsulation layer 170 may include a first inorganic insulating film 171, a foreign material compensation layer 172, and a second inorganic insulating film 173.

Figure 4:
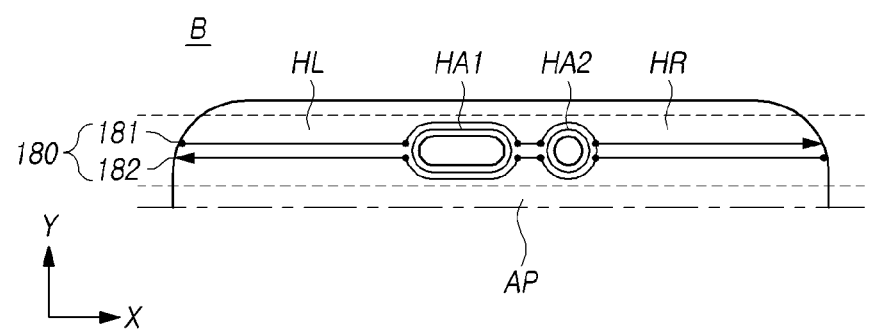
FIG. 4 is an enlarged plan view of area B of FIG. 1 which illustrates lines around a hole area according to an aspect of the present disclosure.

FIG. 4 is an enlarged plan view of area B of FIG. 1 which illustrates lines around a hole area according to an aspect of the present disclosure. Referring to FIG. 4, gate controllers 180 (gate-in-panel (GIP)) for controlling the light-emitting element 150 may be disposed at a left side and a right side of the display area. An initialization voltage line 181 (Vini) and a third scan signal line 182 (SC3($n$)) may extend from the gate controller 180 to be disposed at left and right display areas of the first and second camera holes HA1 and HA2 and may pass the first camera hole HA1 and the second camera hole HA2. Specifically, in describing an example of the initialization voltage line 181, the initialization voltage line 181 starting from the gate controller 180 disposed in a left non-display area may pass through a left display area HL and pass the first camera hole HA1 and the second camera hole HA2 to pass through a right display area HR. In this case, a line made of a material different from an existing metal may jump near the first camera hole HA1 and the second camera hole HA2. In the first camera hole HA1 and the second camera hole HA2, a data line and high potential power line required for driving the light-emitting element 150 should also avoid a camera hole area to pass from top to bottom, and in general, the data line and the high potential power line are provided as low resistance line and overlap with a line used as the initialization voltage line 181. Thus, a jumping structure for this is essential.

Figure 5:
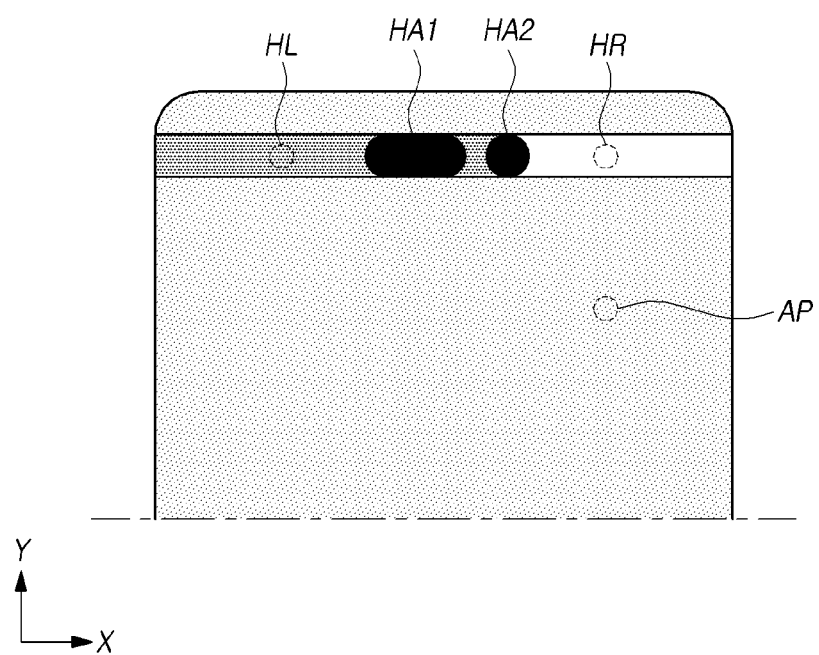
FIG. 5 is a plan view illustrating an abnormality in luminance according to a resistor-capacitor (RC) load deviation that may occur in Comparative Example of the present disclosure.

FIG. 5 is a plan view illustrating an abnormality in luminance according to a resistor-capacitor (RC) load deviation that may occur in Comparative Example of the present disclosure. Referring to FIG. 5, a display area may be divided into a left display area HL, a right display area HR, and an array pixel area AP with respect to a first camera hole HA1 and a second camera hole HA2.

For example, the left display area HL may be a display area positioned at a left side of the first camera hole HA1 and the second camera hole HA2, the right display area HR may be a display area positioned at a right side of the first camera hole HA1 and the second camera hole HA2, and the array pixel area AP may be a display area excluding the left display area HL and the right display area HR.

First, as for an initialization voltage line 181 in order to compare luminance of the left display area HL with luminance of the right display area HR, an RC load of the right display area HR may be greater than an RC load of the left display area HL. Accordingly, a ripple phenomenon may occur in the initialization voltage line 181 of the right display area HR so that the luminance of the right display area HR may increase.

In addition, as for the initialization voltage line 181 in order to compare the luminance of the right display area HR with luminance of the array pixel area AP, the RC load of the right display area HR may be greater than an RC load of the array pixel area AP. Accordingly, a ripple phenomenon may occur in the initialization voltage line 181 of the right display area HR so that the luminance of the right display area HR may increase as compared with the array pixel area AP.

More detailed descriptions will be made below with reference to FIGS. 6 and 7.

Figure 6:
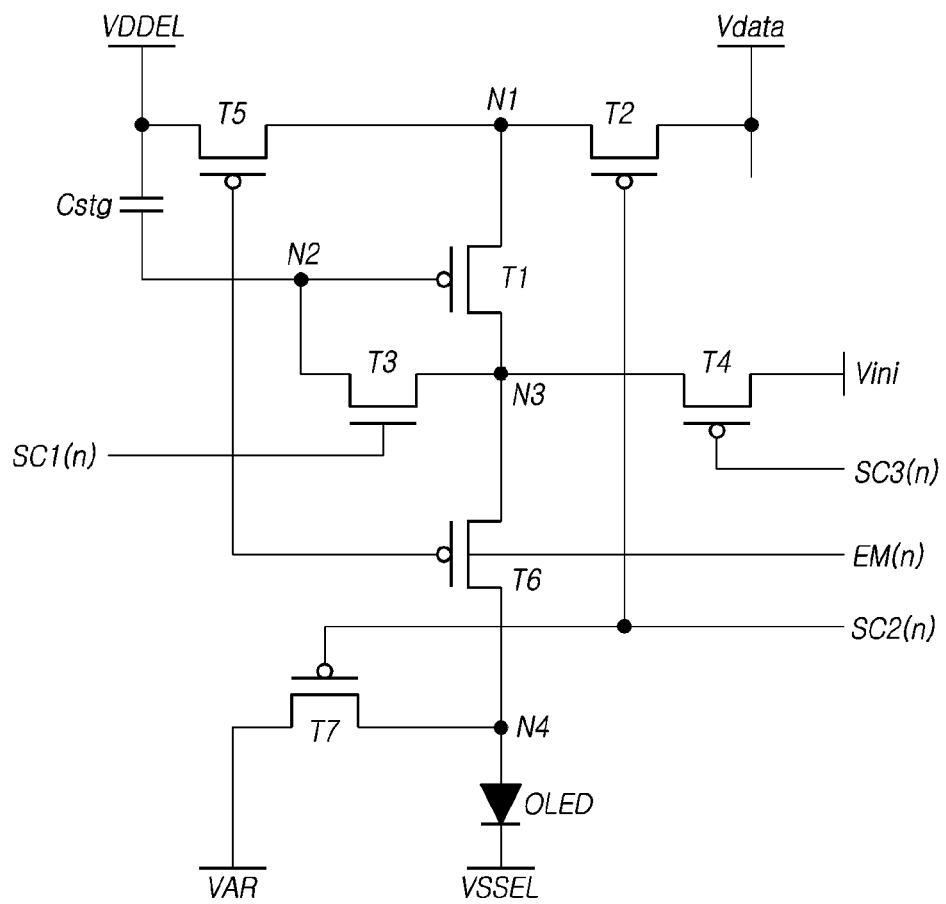
FIG. 6 is a circuit diagram illustrating a pixel of an organic light-emitting display apparatus according to one aspect of the present disclosure.

FIG. 6 is a circuit diagram illustrating a pixel of an organic light-emitting display apparatus according to one aspect of the present disclosure. Each pixel P includes an OLED, a driving transistor T1, second to seventh transistors T2 to T7, and a storage capacitor Cstg.

The OLED emits light using a driving current supplied from the driving transistor T1. A plurality of organic compound layers are formed between an anode and a cathode of the OLED. The organic compound layers may include at least one hole transfer layer and at least one electron transfer layer, and an emission layer EML. Here, the hole transfer layer may be a layer that injects or transfers holes into the emission layer. For example, the hole transfer layer may include a hole injection layer HIL, a hole transport layer HTL, an electron blocking layer EBL, or the like. The electron transfer layer may be a layer that injects or transfers electrons to the emission layer. For example, the electron transfer layer may include an electron transport layer ETL, an electron injection layer EIL, a hole blocking layer HBL, or the like. The anode of the OLED is connected to a fourth node N4, and the cathode of the OLED is connected to an input terminal of a low potential driving voltage source VSSEL.

The driving transistor T1 controls a driving current applied to the OLED according to a source-gate voltage Vsg. The driving transistor T1 may be a p-type metal oxide semiconductor field-effect transistor (MOSFET) (p-channel metal-oxide semiconductor (PMOS) transistor) or a lowtemperature polycrystalline silicon (LTPS) thin film transistor. A source electrode of the driving transistor T1 is connected to a first node N1, a gate electrode thereof is connected to a second node N2, and a drain electrode thereof is connected to a third node N3. The driving transistor T1 may be referred to as a first transistor.

The second transistor T2 applies a data voltage Vdata supplied from a data line to the first node N1 that is the source electrode of the driving transistor T1. The second transistor T2 may be a p-type MOSFET (PMOS transistor) or an LTPS thin film transistor. The second transistor T2 includes a source electrode connected to the data line, a drain electrode connected to the first node N1, and a gate electrode connected to a second scan signal line for transmitting a second scan signal SC2(n).

Accordingly, in response to the second scan signal SC2(n) at a low level that is a turn-on level, the second transistor T2 applies the data voltage Vdata supplied from the data line to the first node N1 that is the source electrode of the driving transistor T1.

The third transistor T3 diode-connects the gate electrode and the drain electrode of the driving transistor T1. The third transistor T3 may be an n-type MOSFET (n-channel metal-oxide semiconductor (NMOS) transistor) or an oxide thin film transistor in order to minimize a leakage current. The third transistor T3 includes a drain electrode connected to the third node N3, a source electrode connected to the second node N2, and a gate electrode connected to a first scan signal line for transmitting a first scan signal SC1(n). Accordingly, in response to the first scan signal SC1(n) at a high level that is a turn-on level, the third transistor T3 diode-connects the gate electrode and the drain electrode of the driving transistor T1.

The fourth transistor T4 connects an initialization voltage line 181 to the third node N3 that is the drain electrode of the driving transistor T1. The fourth transistor T4 may be a p-type MOSFET (PMOS transistor) or an LTPS thin film transistor. The fourth transistor T4 includes a source electrode connected to the initialization voltage line 181 for transmitting an initialization voltage, a drain electrode connected to the third node N3, and a gate electrode connected to a third scan signal line for transmitting a third scan signal SC3(n). Accordingly, in response to a third scan signal SC3(n) at a low level that is a turn-on level, the fourth transistor T4 connects the initialization voltage line 181 to the third node N3 that is the drain electrode of the driving transistor T1.

The fifth transistor T5 applies a high potential driving voltage VDDEL to the first node N1 that is the source electrode of the driving transistor T1. The fifth transistor T5 may be a p-type MOSFET (PMOS transistor) or an LTPS thin film transistor. The fifth transistor T5 includes a source electrode connected to a high potential driving voltage line for transmitting the high potential driving voltage VDDEL, a drain electrode connected to the first node N1, and a gate electrode connected to an emission signal line for transmitting an emission signal EM(n). Accordingly, in response to the emission signal EM(n) at a low level that is a turn-on level, the fifth transistor T5 applies the high potential driving voltage VDDEL to the first node N1 that is the source electrode of the driving transistor T1.

The sixth transistor T6 forms a current path between the driving transistor T1 and the OLED. The sixth transistor T6 may be a p-type MOSFET (PMOS transistor) or an LTPS thin film transistor. The sixth transistor T6 includes a source electrode connected to the third node N3, a drain electrode connected to the fourth node N4, and a gate electrode connected to the emission signal line for transmitting the emission signal EM(n). In response to the emission signal EM(n), the sixth transistor T6 forms a current path between the third node N3 that is the source electrode of the sixth transistor T6 and the fourth node N4 that is the drain electrode of the sixth transistor T6. Thus, in response to the emission signal Em(n) at a low level that is a turn-on level, the sixth transistor T6 forms the current path between the driving transistor T1 and the OLED.

The seventh transistor T7 applies a reset voltage VAR to the fourth node N4 that is the anode of the OLED. The seventh transistor T7 may be a p-type MOSFET (PMOS transistor) or an LTPS thin film transistor. The seventh transistor T7 includes a source electrode connected to a reset voltage line for transmitting the reset voltage VAR, a drain electrode connected to the fourth node N4, and a gate electrode connected to the second scan signal line for transmitting the second scan signal SC2(n). Accordingly, in response to the second scan signal SC2(n) at a low level that is a turn-on level, the seventh transistor T7 applies the reset voltage VAR to the fourth node N4 that is the anode of the OLED.

The storage capacitor Cstg maintains the data voltage Vdata stored in each pixel during one frame. The storage capacitor Cstg includes a first electrode connected to the second node N2 and a second electrode connected to the high potential driving voltage line for transmitting the high potential driving voltage VDDEL. That is, one electrode of the storage capacitor Cstg is connected to the gate electrode of the driving transistor T1, and the other electrode of the storage capacitor Cstg is connected to the high potential driving voltage line for transmitting the high potential driving voltage VDDEL.

Figure 7:
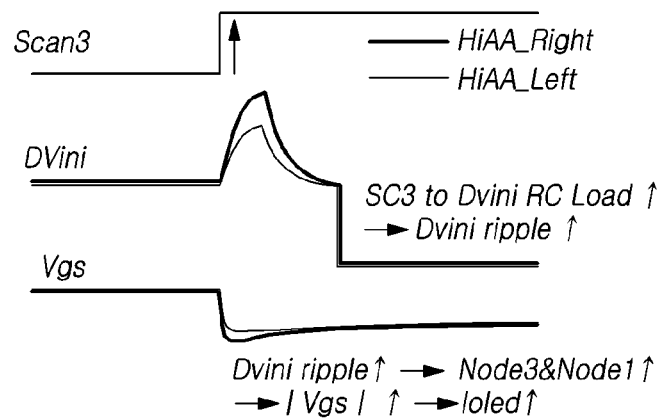
FIG. 7 is a timing chart for identifying a cause of an increase in luminance due to a third scan signal line (182) and an initialization voltage line (181) in the circuit diagram of FIG. 6.

FIG. 7 is a timing chart for identifying a cause of an increase in luminance due to a third scan signal line 182 and the initialization voltage line 181 in the circuit diagram of FIG. 6. Referring to FIG. 7, when the third scan signal line 182 is turned on, an RC load of the initialization voltage line 181 increases due to a coupling phenomenon, and a ripple phenomenon occurs accordingly. The ripple phenomenon may be a phenomenon occurring when a specific line is affected by being coupled with an adjacent line, and in particular, an output voltage of the specific line fluctuates like a wave according to the turn-on or turn-off of the adjacent line.

Due to the ripple phenomenon of the initialization voltage line 181, a voltage applied to the first node N1 and the third node N3 in the circuit diagram of FIG. 6 increases. This causes an increase in the source-gate voltage Vsg of the first transistor T1 used as the driving transistor, thereby resulting in an increase in emission luminance.

Referring to FIGS. 5 and 7, an RC load of the initialization voltage line 181 of the right display area HR may be greater than an RC load of the initialization voltage line 181 of the left display area HL. Thus, a ripple phenomenon occurs in the right display area HR, and due to an increase in voltage applied to the first node N1 and the third node N3 in a circuit of the right display area HR and an increase in source-gate voltage Vsg of the first transistor T1 that is the driving transistor, ultimately, emission luminance of the right display area HR is increased.

In addition, even when the right display area HR is compared with the array pixel area AP, the RC load of the initialization voltage line 181 may be greater in the right display area HR, and thus a ripple phenomenon may occur in the right display area HR. Similarly, due to an increase in voltage applied to the first node N1 and the third node N3 in the circuit of the right display area HR and an increase in source-gate voltage Vsg of the first transistor Ti that is the driving transistor, ultimately, the emission luminance of the right display area HR is higher than that of the array pixel area AP.

Figure 8A:
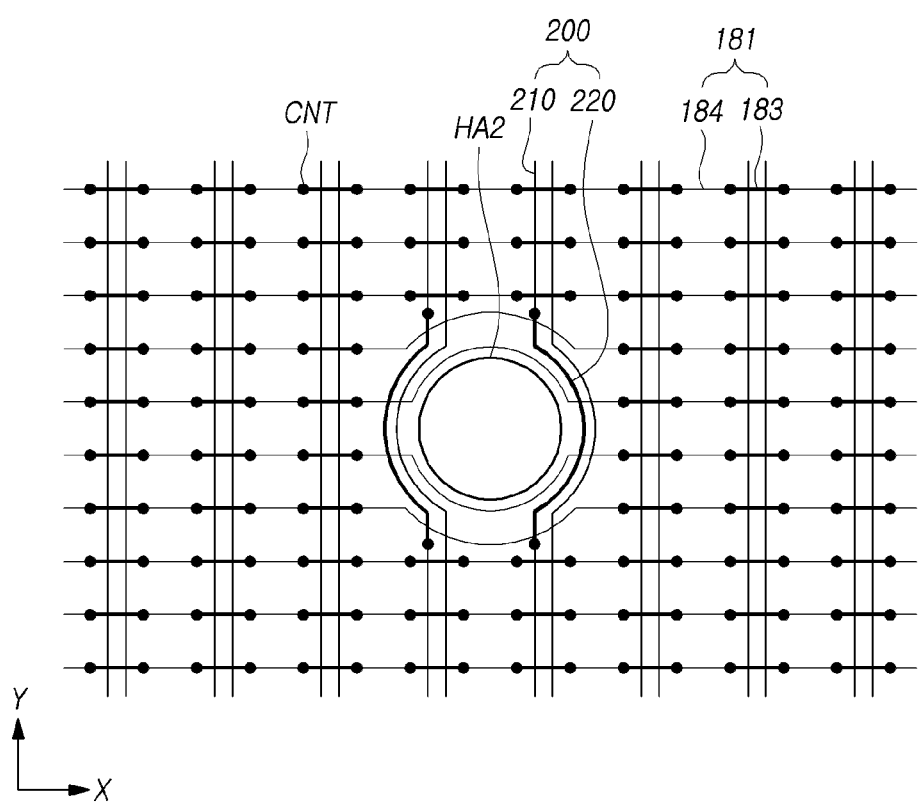
FIGS. 8A and 8B are plan views illustrating a planar line structure according to an aspect of the present disclosure.
Figure 8B:
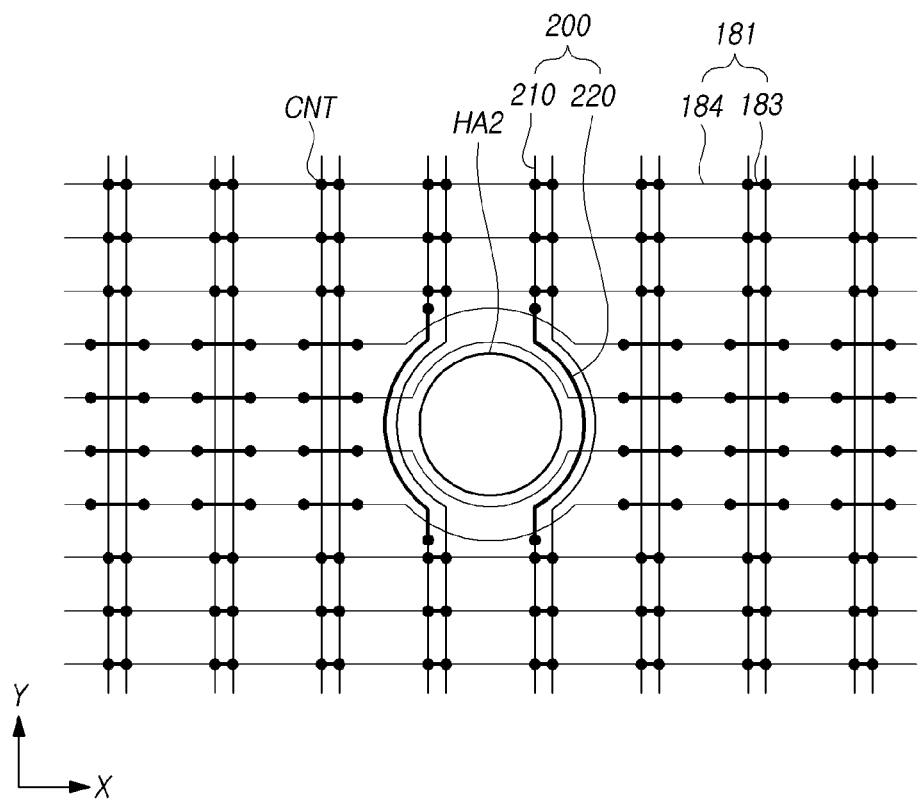

FIGS. 8A and 8B are plan views illustrating a planar line structure according to an aspect of the present disclosure. In FIGS. 8A and 8B, a second camera hole HA2 will be described as a representative of a plurality of camera holes. Referring to FIG. 8A, a line arrangement at a peripheral portion with respect to the second camera hole HA2 is illustrated. A high resistance line 183 and a low resistance line 184 are mixed to constitute a initialization voltage line 181 near the second camera hole HA2, thereby increasing overall line resistance. Accordingly, it is possible to reduce an RC load deviation between a right display area HR and a left display area HL of the second camera hole HA2. In addition, the RC load deviation between the right display area HR and the array pixel area AP can be reduced with respect to the second camera hole HA2.

In the present disclosure, the high resistance line 183 may have a first resistance value, and the low resistance line 184 may have a second resistance value lower than the first resistance value. The first resistance value and the second resistance value do not mean absolute resistance values. The first resistance value only needs to be higher than the second resistance value. This can also be applied to other types of lines.

The initialization voltage line 181 disposed in a display area may be arranged as the high resistance line 183 and the low resistance line 184, and contact holes CNT for jumping may be formed.

A section in which the high resistance line 183 is disposed in the display area may be limited to a section overlapping with a data line 200. Since a low resistance line having low resistance is mainly used as the data line 200, the data line 200 cannot overlap with the low resistance line 184 constituting the initialization voltage line 181. Accordingly, in the vicinity in which the data line 200 is disposed, the low resistance line 184 may be electrically connected to the high resistance line 183 through the contact holes CNT and extend.

Referring to FIG. 8A, the high resistance line 183 and the low resistance line 184 of the initialization voltage line 181 may be disposed to each have a constant length in the entire display area.

Referring to FIG. 8A, the data line 200 may include a first data line 210 and a second data line 220 near the second camera hole HA2. The data line 200 is generally connected to pixels in the display area through the first data line 210, but since the data line 200 cannot overlap with the low resistance line 184 of the initialization voltage line 181 near the second camera hole HA2, other lines may be used, for example, the connection electrode 145 described above with reference to FIG. 3 may be used. Near the second camera hole HA2, the low resistance line 184 of the initialization voltage line 181 may be disposed, and the high resistance line 183 may not be disposed. Since the initialization voltage line 181 bypasses the second camera hole HA2 and has a curved planar shape, a length thereof may increase and damage may occur in terms of resistance. Thus, in order to minimize an increase in resistance, only the low resistance line 184 may be disposed.

Referring to FIG. 8B, similarly to that shown in FIG. 8A, the initialization voltage line 181 may include the high resistance line 183 and the low resistance line 184 electrically connected through the contact hole CNT. As in that shown FIG. 8A, an RC load deviation between a left side and a right side of the second camera hole HA2 or between an upper side and a lower side of the second camera hole HA2 may be reduced by increasing an overall resistance of the initialization voltage line 181. Unlike that shown in FIG. 8A, in FIG. 8B, lengths of the high resistance line 183 and the low resistance line 184 constituting the initialization voltage line 181 are different for each section.

For example, the low resistance line 184 and the high resistance line 183 are disposed such that lengths thereof in the left display area HL of the second camera hole HA2 are similar to lengths thereof in the right display area HR of the second camera hole HA2, thereby reducing an RC load deviation for each area.

However, the low resistance line 184 and the high resistance line 183 are disposed such that lengths thereof in the left and right display areas HL and HR of the second camera hole HA2 are different from lengths thereof in an array pixel area AP. In the array pixel area AP, the length of the high resistance line 183 is minimized to minimize an increase in resistance. Since an area of the second camera hole HA2 is small in the display area but the remaining array pixel area AP occupies a wide space, the length of the high resistance line 183 in the array pixel area AP is minimized, thereby preventing overall performance degradation.

Figure 9:
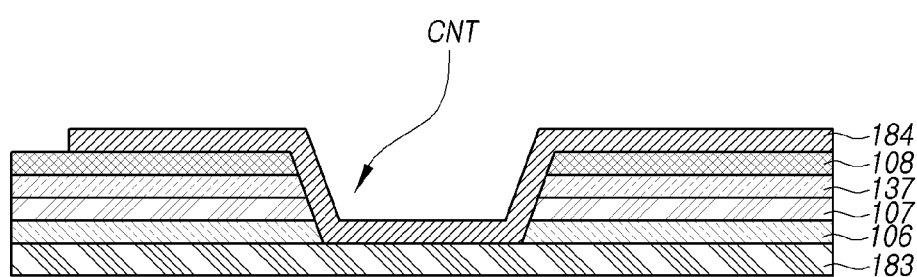
FIG. 9 is a cross-sectional view illustrating a cross section of a contact hole (CNT) according to an aspect of the present disclosure.

FIG. 9 is a cross-sectional view illustrating a cross section of a contact hole CNT according to an aspect of the present disclosure.

Referring to FIG. 9, it can be seen how a high resistance line 183 and a low resistance line 184 of an initialization voltage line 181 are electrically connected in the contact hole CNT. The high resistance line 183 may be made of a metal and used for a first gate electrode 122 in a pixel area. The low resistance line may be made of a metal and used for first source and drain electrodes 121 and 124 in the pixel area. A second lower interlayer insulating film 106, an upper buffer layer 107, an upper gate insulating film 137, and the like may be disposed between the high resistance line 183 and the low resistance line 184, thereby insulating the high resistance line 183 from the low resistance line 184 in an area excluding the contact hole CNT.

Figure 10A:
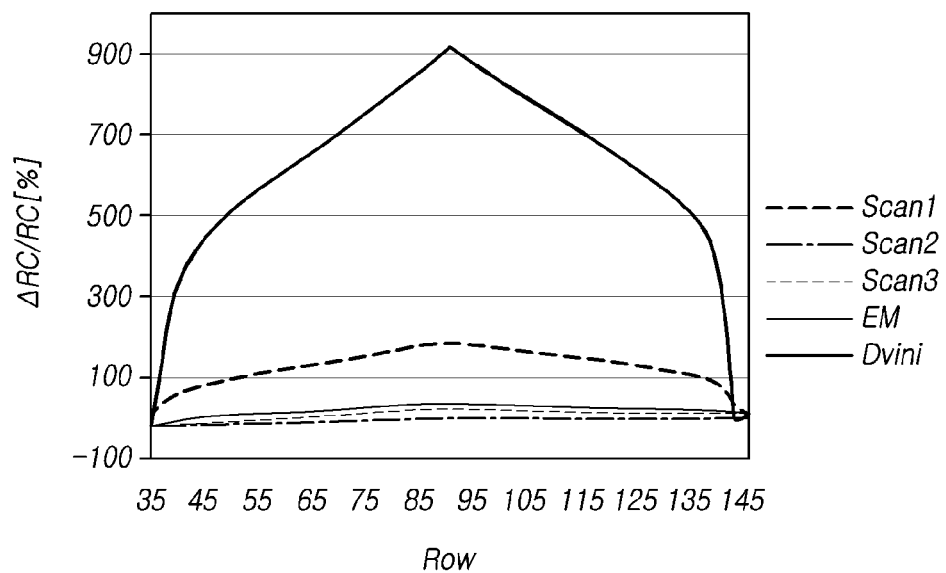
FIGS. 10A and 10B are graphs showing numerical values related to an RC load deviation for each area.
Figure 10B:
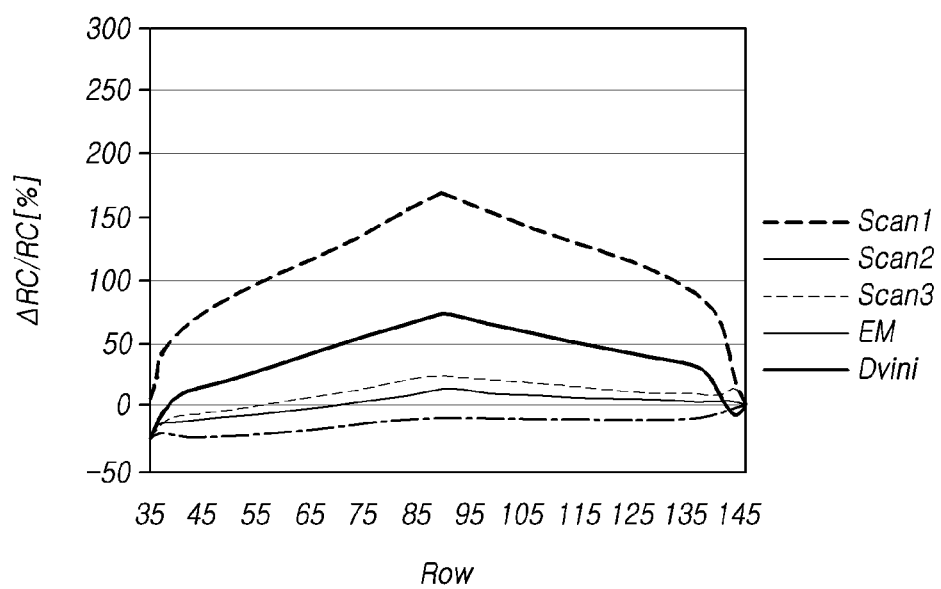

FIGS. 10A and 10B are graphs showing numerical values related to an RC load deviation for each area. In FIG. 10A, an RC load deviation was measured when the entirety of an initialization voltage line 181 according to Comparative Example of the present disclosure was provided as a low resistance line. An X-axis of the graph sequentially represents a left display area HL, a right display area HR, and an array pixel area AP from left to right, and a Y-axis of the graph represents measured values of an RC load of a corresponding area. It can be seen that a percentage of each of resistance R, capacitance C, and an RC delay ? to a reference value is measured. In Comparative Example of FIG. 10A, it can be seen that a value of an RC load is the lowest in the left display area HL, is the highest in the right display area HR, and is lowered in the array pixel area AP. In particular, a percentage of an RC load deviation may exceed a level of about 900% in the right display area HR. It can be seen that the level is very high when compared with that of other third scan signal lines 182 or the like. Luminance of the right display area HR increases due to the RC load deviation.

Referring to FIG. 10B, when measurement is performed on a structure, to which an aspect of the present disclosure is applied, in the same manner as in that shown in FIG. 10A, it can be seen that an RC load deviation of an initialization voltage line 181 is considerably reduced, and thus the deviation is lower than that of a first scan signal line.

Although a display apparatus according to an aspect of the present disclosure has been described based on the fact that a substrate corresponding to a camera hole CH is removed by a laser, the present disclosure is not necessarily limited thereto, and a component of the substrate or only a portion of the substrate may be removed.

A display apparatus according to an aspect of the present disclosure may include an LCD, a field emission display device (FED), an OLED display device, and a QD display device.

The display apparatus according to the aspect of the present disclosure may include a set electronic device/apparatus or a set device (or a set apparatus) such as a laptop computer, a television, a computer monitor, an equipment display apparatus including an automotive display apparatus or another type apparatuses for vehicles, or a mobile electronic device/apparatus such as a smartphone or an electronic pad, which is a complete product (or a final product) including an LCM, an OLED module, or the like.

A display apparatus according to an aspect of the present disclosure described above may be briefly described again as follows.

A display apparatus according to aspects of the present disclosure may include a substrate including a display area, a camera hole, and a non-display area, a light-emitting element disposed in the display area, a gate driver disposed in the non-display area, and an initialization signal line disposed in the display area.

In the display apparatus according to the aspects of the present disclosure, the display area may include a left display area, a right display area, and an array pixel area with respect to the camera hole and may include the initialization signal line disposed in each of the left display area and the right display area.

In the display apparatus according to the aspects of the present disclosure, the initialization signal line may include a low resistance initialization signal line and a high resistance initialization signal line.

In the display apparatus according to the aspects of the present disclosure, the low resistance initialization signal line and the high resistance initialization signal line may be electrically connected through a contact hole.

In the display apparatus according to the aspects of the present disclosure, the low resistance initialization signal line may be disposed near the camera hole to have a planar curved shape.

The display apparatus according to the aspects of the present disclosure may further include a data line disposed in the display area, and the data line may include a first data line and a second data line.

In the display apparatus according to the aspects of the present disclosure, the second data line may at least partially overlap with the low resistance initialization signal line near the camera hole.

In the display apparatus according to the aspects of the present disclosure, the low resistance initialization signal line and the high resistance initialization signal line may each have a constant length in the entire display area.

In the display apparatus according to the aspects of the present disclosure, the low resistance initialization signal line and the high resistance initialization signal line may have different lengths in at least a portion of the display area.

A display apparatus according to aspects of the present disclosure may include a substrate including a display area, a camera hole, and a non-display area, a light-emitting element disposed in the display area, a gate driver disposed in the non-display area, and an initialization signal line disposed in the display area.

In the display apparatus according to the aspects of the present disclosure, the display area may include a left display area, a right display area, and an array pixel area with respect to the camera hole, and the initialization signal line may include a low resistance initialization signal line and a high resistance initialization signal line.

In the display apparatus according to the aspects of the present disclosure, the low resistance initialization signal line may be disposed in the left display area, the right display area, and at least a portion of the array pixel area.

In the display apparatus according to the aspects of the present disclosure, the low resistance initialization signal line and the high resistance initialization signal line may be electrically connected through a contact hole.

In the display apparatus according to the aspects of the present disclosure, the low resistance initialization signal line may be disposed in the vicinity of the camera hole to have a planar curved shape.

The display apparatus according to the aspects of the present disclosure may further include a data line disposed in the display area, and the data line may include a first data line and a second data line.

In the display apparatus according to the aspects of the present disclosure, the second data line may at least partially overlap with the low resistance initialization signal line in the vicinity of the camera hole.

In the display apparatus according to the aspects of the present disclosure, the low resistance initialization signal line and the high resistance initialization signal line may each have a constant length in the entire display area.

In the display apparatus according to the aspects of the present disclosure, the low resistance initialization signal line and the high resistance initialization signal line may have different lengths in at least a portion of the display area.

The features, structures, and effects described above in the examples of the present disclosure are included in at least one example of the present disclosure, but the present disclosure is not limited to only one example. Furthermore, the features, structures, and effects described in at least one example of the present disclosure may be implemented through combinations or modifications of other examples by those skilled in the art to which the present disclosure belongs. Therefore, content associated with the combinations and modifications should be construed as being within the scope of the present disclosure.

It will be apparent to those skilled in the art to which the present disclosure belongs that the present disclosure is not limited to the above-described aspects and the accompanying drawings and various substitutions, modifications, and variations can be made without departing from the spirit or scope of the present disclosure. Thus, the scope of the present disclosure is defined by the claims described below, and the present disclosure should be construed to cover all modifications or variations induced from the meaning and scope of the appended claims and their equivalents.

What is claimed is:
1. A display apparatus comprising:
a substrate including a display area, a camera hole, and a non-display area;
a light-emitting element disposed in the display area;
a gate driver disposed in the non-display area; and
an initialization signal line disposed in the display area, wherein the display area includes left and right display areas with respect to the camera hole, and an array pixel area, and wherein the initialization signal line comprises a plurality of low resistance initialization signal lines disposed along a first direction and a plurality of high resistance initialization signal lines disposed along the first direction in each of the left display area and the right display area.

2. The display apparatus of claim 1, wherein the plurality of low resistance initialization signal lines and the plurality of high resistance initialization signal lines are electrically connected through contact holes.

3. The display apparatus of claim 2, wherein at least one of the low resistance initialization signal lines is disposed near the camera hole and has a planar curved shape.

4. The display apparatus of claim 3, further comprising a data line disposed in the display area, wherein the data line comprises a first data line and a second data line.

5. The display apparatus of claim 4, wherein the second data line at least partially overlaps with the at least one of the plurality of low resistance initialization signal lines near the camera hole.

6. The display apparatus of claim 1, wherein each of the plurality of low resistance initialization signal lines and the plurality of high resistance initialization signal lines has a constant length in an entirety of the display area.

7. The display apparatus of claim 1, wherein the plurality of low resistance initialization signal lines and the plurality of high resistance initialization signal lines have different lengths in at least a portion of the display area.

8. A display apparatus comprising:

a substrate comprising a display area, a camera hole, and a non-display area;

a light-emitting element disposed in the display area;

a gate driver disposed in the non-display area; and an initialization signal line disposed in the display area, wherein the display area comprises left and right display areas with respect to the camera hole, and an array pixel area, and wherein the initialization signal line comprises a plurality of low resistance initialization signal lines and a plurality of high resistance initialization signal lines alternately connected in series along a first direction.

9. The display apparatus of claim 8, wherein the plurality of low resistance initialization signal lines are disposed in the left display area, the right display area, and at least a portion of the array pixel area.

10. The display apparatus of claim 9, wherein the plurality of low resistance initialization signal lines and the plurality of high resistance initialization signal lines are electrically connected through contact holes.

11. The display apparatus of claim 10, wherein at least one of the low resistance initialization signal lines is disposed near the camera hole and has a planar curved shape.

12. The display apparatus of claim 11, further comprising a data line disposed in the display area, wherein the data line comprises a first data line and a second data line.

13. The display apparatus of claim 12, wherein the second data line at least partially overlaps with the at least one of the low resistance initialization signal lines near the camera hole.

14. The display apparatus of claim 9, wherein each of the plurality of low resistance initialization signal lines and the plurality of high resistance initialization signal lines has a constant length in an entirety of the display area.

15. The display apparatus of claim 9, wherein the plurality of low resistance initialization signal lines and the plurality of high resistance initialization signal lines have different lengths in at least a portion of the display area.

16. The display apparatus of claim 15, wherein the plurality of low resistance initialization signal lines and the plurality of high resistance initialization signal lines have different lengths in the left and right display areas than in the array pixel area.

17. The display apparatus of claim 4, wherein at least a portion of the data line extends along a second direction in the display area, intersecting the first direction.

18. The display apparatus of claim 12, wherein at least a portion of the data line extends along a second direction in the display area, intersecting the first direction.

* * * * *